United States Patent [19]
Anderson

[11] Patent Number: 5,500,624
[45] Date of Patent: Mar. 19, 1996

[54] INPUT STAGE FOR CMOS OPERATIONAL AMPLIFIER AND METHOD THEREOF

[75] Inventor: David J. Anderson, Scottsdale, Ariz.

[73] Assignee: Motorola, Inc., Schaumburg, Ill.

[21] Appl. No.: 333,466

[22] Filed: Nov. 2, 1994

[51] Int. Cl.[6] ..................................................... H03F 3/45
[52] U.S. Cl. ........................ 330/253; 330/258; 330/261
[58] Field of Search .................................... 330/253, 256, 330/258, 261

[56] References Cited

U.S. PATENT DOCUMENTS

| | | | |
|---|---|---|---|
| 4,555,673 | 11/1985 | Huijsing et al. | 330/258 |
| 4,890,052 | 12/1989 | Hellums. | |
| 5,311,145 | 5/1994 | Huijsing. | |
| 5,381,112 | 1/1995 | Rybicki et al. | 330/253 |

OTHER PUBLICATIONS

W. S. Wu et al., "Digital–Compatible High–Performance Operational Amplifier with Rail–to–Rail Input and Output Ranges," IEEE Journal, vol. 29, No. 1, Jan. 1994, pp. 63–66.

A. Coban et al., "A 1.75V Rail–to–Rail CMOS Op Amp," IEEE Int. Symposium on Circuits and Systems, vol. 5, 1994 pp. 497–500.

*Primary Examiner*—James B. Mullins
*Attorney, Agent, or Firm*—Robert D. Atkins

[57] ABSTRACT

A CMOS amplifier input stage (10) has an n-channel differential input transistor pair (12, 14) and a p-channel differential input pair (26, 28) for receiving an input signal ($V_p$, $V_m$). Each transistor pair is respectively coupled to current shunt transistors (20, 32) and to current source transistors (16, 30) that generate currents that are inversely proportional to transistor mobilities. Bias generators (24, 34) apply a voltage to the gates of the shunting transistors respectively. When the input stage receives a common mode signal equal to the voltage applied by the bias generators, three-fourths of transistor (16) current flows through shunt transistor (20). Likewise, three-fourths of transistor (30) current flows through shunt transistor (32). As a result, the transconductance of the n-channel differential input transistor pair is matched to the transconductance of the p-channel differential input pair, and the transconductance of the input stage remains constant throughout the common mode range for the input stage of the amplifier.

19 Claims, 1 Drawing Sheet

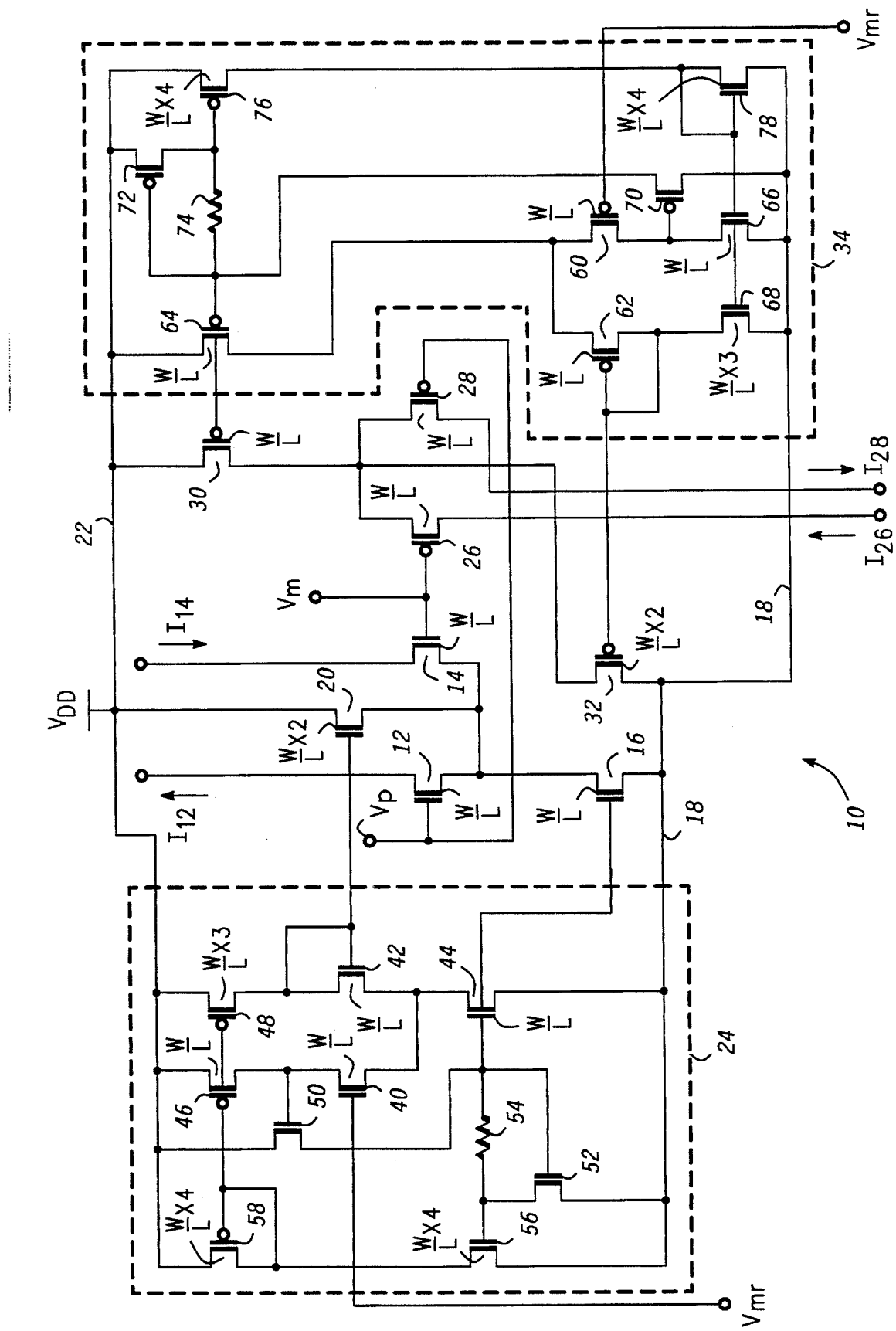

INPUT STAGE FOR CMOS OPERATIONAL AMPLIFIER AND METHOD THEREOF

BACKGROUND OF THE INVENTION

The present invention relates in general to operational amplifiers and, more particularly, to an input stage of an operational amplifier operating rail-to-rail with a constant transconductance.

Operational amplifiers are commonly used in electronic circuit design to amplify an input signal and provide an amplified output signal. The operational amplifier typically includes an input stage for the initial amplification and an output stage for providing drive capability and possibly further amplification. The amplifier may further include intermediate stages for level shifting and conversion to single-ended operation.

The input stage to the operational amplifier is provides initial gain and is used to define the bandwidth of the amplifier. The input stage has an associated transconductance as the gain between the voltage input signal and the current supply to either the intermediate stages or the final output stage of the amplifier. It is desirable to have a constant transconductance for the input stage to provide constant bandwidth and constant gain for the amplifier. If the transconductance of the amplifier of the input stage varies, the output stage bandwidth must be increased to maintain stability for the amplifier.

One amplifier input stage known in the prior art includes complementary p-channel and n-channel differential transistor pairs. A single current source biases one pair of the differential amplifiers, for example the p-channel transistors. The current source is routed through a current mirror circuit to bias the opposite differential pair of the n-channel transistors. A current steering mechanism controls how much of the current source is applied to each differential transistor pair. Unfortunately, such a structure allows the common mode input voltage to vary the transconductance of the differential input pairs by 41% or more, over the full common mode input range. As noted above, the variation in transconductance requires a wider bandwidth in the output stage to prevent instability problems.

Hence, a need exists for an input stage of an operational amplifier operating rail-to-rail with a constant transconductance.

BRIEF DESCRIPTION OF THE DRAWING

The sole figure illustrates a schematic diagram of an operational amplifier input stage including bias generators for controlling amplifier transconductance.

DETAILED DESCRIPTION OF THE PREFERRED EMBODIMENT

Referring to the sole figure, an amplifier input stage 10 is shown suitable for manufacturing as an integrated circuit using conventional integrated circuit processes. A differential input signal $V_p$ and $V_m$ is applied to the gates of differentially coupled n-channel transistors 12 and 14. The drains of transistors 12 and 14 provide differential currents $I_{12}$ and $I_{14}$ to the output stage of the amplifier. The sources of transistors 12 and 14 are coupled to the drain of n-channel transistor 16 that further includes a source coupled to power supply conductor 18 operating at ground potential. N-channel shunt transistor 20 includes a drain coupled to power supply conductor 22 operating at a positive potential $V_{DD}$ such as 5 volts. The source of transistor 20 is coupled to the common sources of transistors 12 and 14. A bias generating circuit 24 provides bias signals to the gate of transistor 16 and to the gate of transistor 20.

Input stage 10 further includes differentially coupled p-channel transistors 26 and 28 with gates coupled for receiving differential input signal $V_m$ and $V_p$, respectively. The common sources of transistors 26 and 28 are coupled to the drain of p-channel transistor 30. The source of transistor 30 is coupled to power supply conductor 22. P-channel shunt transistor 32 includes a source coupled to the common sources of transistors 26 and 28 and a drain coupled to power supply conductor 18. A bias generator circuit 34 provides bias signals to the gates of transistor 30 and 32.

Further detail of bias generator circuit 24 is also shown in the sole figure, including differential n-channel transistors 40 and 42 where the gate of transistor 40 receives a bias reference such as $V_{mr}$ operating, for example, at the midway point between power supply potential $V_{DD}$ and ground potential. The common sources of transistors 40 and 42 are coupled to the drain of current source n-channel transistor 44. The source of transistor 44 is coupled to power supply conductor 18. The drain of transistor 40 is coupled to the drain of current source p-channel transistor 46, while the drain of transistor 42 is coupled to the drain of current source p-channel transistor 48. The gate and drain of transistor 42 are coupled together for providing a first bias signal to the gate of transistor 20. N-channel transistor 50 includes a drain coupled to power supply conductor 22, and a gate coupled to the drain of transistor 40, and a source coupled to the gate of n-channel transistor 44. N-channel transistor 52 includes a drain coupled through resistor 54 to the source of transistor 50, a gate coupled to the source of transistor 50, and a source coupled to power supply conductor 18. N-channel transistor 56 has its source coupled to power supply conductor 18 and its gate coupled to the drain of transistor 52. The drain of transistor 56 is coupled to the drain and gate of p-channel transistor 58 that operates as an input of a current mirror that provides a bias for current source transistors 46 and 48. The drain and gate of transistor 58 are coupled to the gates of transistors 46 and 48. The sources of transistors 58, 46, and 48 are coupled to power supply conductor 22.

The operation of bias generator circuit 24 proceeds as follows. The length to width ratio of transistor 48 is sized three times larger than that of transistor 46 and therefore conducts three times the current as transistor 46. The mismatch in transistor sizes causes unequal currents to flow through transistors 40 and 42 that creates a positive voltage shift at the gate of transistor 20 greater than the bias reference $V_{mr}$. The current mirror arrangements of transistors 46, 48, and 58 force the currents in transistor 44 to equal the current flow in transistor 56. The length to width ratio of transistor 56 is sized four times as large as transistor 44, hence the gate voltage to transistor 44 must be larger than the gate voltage to transistor 56. A potential difference develops across resistor 54 and causes a current to flow through the resistor proportional to the voltage difference. The current flowing through resistor 54 also flows through transistor 52. Consequently, a voltage must develop at the gate of transistor 52 to sink the current from resistor 54 through the drain of transistor 52. Since the gate voltage of transistors 44 and 52 are equal, the drain currents are ratioed according to their relative sizes. Transistor 50 provides the source of current to flow through resistor 54 and transistor 52. The voltage developed at the gate of transistor 44 provides the bias signal to the gate of transistor 16. Thus, the currents flowing in bias generator circuit 24 are set by the voltage drop across resistor 54.

Transistors 12 and 14 provide a transconductance from inputs $V_p$ and $V_m$ to currents $I_{12}$ and $I_{14}$. The transconductance of an input stage of an amplifier is defined as the ratio of the output current of the input stage to the input voltage of the input stage. The level of transconductance of transistors 12 and 14, in the strong inversion region of operation, is proportional to the square root of the currents flowing through them. Transistor 20 provides a current steering mechanism to vary the currents flowing through transistors 12 and 14. When common mode voltage $V_p$ and $V_m$ is set up to the mid-range bias reference $V_{mr}$, the current flowing through transistor 20 is equal to three-quarters of the current flowing through transistor 16. As common mode voltage $V_p$ and $V_m$ increases from $V_{mr}$ a larger percentage of the current flows through transistors 12 and 14. The currents through transistors 12 and 14 eventually reach 100% of the current flowing through transistor 16. When common mode voltage $V_p$ and $V_m$ decreases from $V_{mr}$ the current flowing through transistors 12 and 14 eventually reaches zero. When the current of transistors 12 and 14 is zero transistor 20 conducts a 100% of the current that flows through transistor 16.

Further detail of bias generator circuit 34 is also shown in the sole figure, including differential p-channel transistors 60 and 62, where the gate of transistor 60 receives a bias reference such as $V_{mr}$. The common sources of transistors 60 and 62 are coupled to the drain of p-channel current source transistor 64. The source of transistor 64 is coupled to power supply conductor 22. The drain of transistor 60 is coupled to the drain of n-channel current source transistor 66 while the drain of transistor 62 is coupled to n-channel current source transistor 68. The gate and drain of transistor 62 are coupled together for providing a second bias signal to the gate of transistor 32. P-channel transistor 70 includes a drain coupled to power supply conductor 18, and a gate coupled to the drain of transistor 60, and a source coupled to the gate of transistor 64. P-channel transistor 72 includes a drain coupled through resistor 74 to the source of transistor 70, and a gate coupled to the source of transistor 70, and a source coupled to power supply conductor 22. P-channel transistor 76 has its source coupled to power supply conductor 22 and its gate coupled to the drain of transistor 72. The drain of transistor 76 is coupled to the drain and gate of n-channel transistor 78 that operates as an input of a current mirror that provides a bias potential for current source transistors 66 and 68. The drain and gate of transistor 78 are coupled to the gates of transistors 66 and 68. The sources of transistors 78, 66, and 68 are coupled to power supply conductor 18.

The operation of bias generator circuit 34 proceeds as follows. The length to width ratio of transistor 68 is sized three times larger than that of transistor 66 and therefore conducts three times the current as transistor 66. The mismatch in transistor sizes causes unequal currents to flow through transistors 60 and 62 that creates a negative voltage shift at the gate of transistor 32 greater than the bias reference $V_{mr}$. The current mirror arrangements of transistors 66, 68, and 70 force the currents in transistor 64 to equal the current flow in transistor 76. The length to width ratio of transistor 76 is sized four times as large as transistor 64 hence the gate to source voltage to transistor 64 must be larger than the gate to source voltage to transistor 76. A potential difference develops across resistor 74 and causes a current to flow through the resistor proportional to the voltage difference. The current flowing through resistor 74 also flows through transistor 72. Consequently, a voltage must develop at the gate of transistor 72 to source the current from resistor 74 through the drain of transistor 72. Since the gate voltage of transistors 64 and 72 are equal, the drain currents are ratioed according to there relative sizes. Transistor 70 provides the source of current to flow through resistor 74 and transistor 72. The voltage developed at the gate of transistor 64 provides the bias potential signal to the gate of transistor 30. Thus, the currents flowing in bias generator circuit 34 are set by the voltage drop across resistor 74.

Transistors 28 and 26 provide a transconductance from inputs $V_p$ and $V_m$ to currents $I_{28}$ and $I_{26}$. The level of transconductance of transistors 28 and 26 is proportional to the square root of the currents flowing through them. Transistor 32 provides a current steering mechanism to vary the currents flowing through transistors 28 and 26. When common mode voltage $V_p$ and $V_m$ is set up to the mid-range bias potential reference $V_{mr}$ the current flowing through transistor 32 is equal to three-quarters of the current flowing through transistor 30.

As a feature of the present invention, when common mode voltage $V_p$ and $V_m$ is set up to the mid-range bias potential reference $V_{mr}$, the transconductance of differential input transistors 26 and 28 is the same as the transconductance of differential input transistors 12 and 14. As common mode voltage $V_p$ and $V_m$ increases from $V_{mr}$ a smaller percentage of the current flows through transistors 28 and 26. The currents through transistors 28 and 26 eventually reach zero. When the current of transistors 28 and 26 is zero transistor 32 conducts a 100% of the current that flows through transistor 30. When common mode voltage $V_p$ and $V_m$ decreases from $V_{mr}$ a larger percentage of current flows through transistors 28 and 26. The currents through transistors 28 and 26 eventually reach 100% of the current flowing through transistor 30. Thus, as the common mode voltage varies from $V_{mr}$, the transconductance of differential input transistor pair 12 and 14 varies in one direction, and the transconductance of differential input transistor pair 26 and 28 varies in the opposite direction to produce a constant total transconductance for amplifier input stage 10, another feature of the present invention.

The operating current of the n-channel differential input stage for amplifier input stage 10 is set by the value of the voltage drop across resistor 54, and the operating current of the p-channel differential input stage is set by the value of the voltage drop across resistor 74. The voltage drop across resistor 54 varies inversely to the n-channel transistor mobility. In a similar manner, the voltage drop across resistor 74 varies inversely to the p-channel transistor mobility. Thus, the transconductance can be made independent of temperature and process variables by matching resistor 54 to resistor 74.

In an alternate embodiment, the bias potential voltages applied to the gate of transistor 20 and transistor 32 are equal to the mid-range power supply conductor voltage. The size of transistor 20 is increased from the size of transistors 12 and 14 such that, when common mode voltage $V_p$ and $V_m$ is equal to the bias potential applied to the gate of transistor 20 and transistor 32, three-quarters of the current of transistor 16 is steered through transistor 20. In a similar manner, transistor 32 increases from the size of transistors 26 and 28 such that when common mode voltage $V_p$ and $V_m$ is equal to the bias potential applied to the gate of transistor 20 and transistor 32, three-quarters of the current of transistor 30 is directed through transistor 32. Hence, the transconductance of the n-channel differential input transistor pair is equal to the transconductance of the p-channel differential input transistor pair. A change in common mode voltage would cause the current in one differential input transistor pair to increase while creating an offsetting decrease in current in the other differential input transistor pair. Thus, the transconductance of the input stage of the amplifier remains constant. The transconductance can be made process and temperature independent by providing a bias current to the n-channel and p-channel transistor pairs that varies inversely proportional to the n-channel and p-channel transistor mobilities, respectively.

In an alternate embodiment of the present invention, resistors 54 and 74 may be placed external to the integrated circuit. Resistors 54 and 74 are placed external to the integrated circuit to minimize the effects of temperature variations in resistors 54 and 74 to reduce variation in nominal bandwidth of the input stage of amplifier 10. External resistors 54 and 74 may be thin film or discrete components. Thin film resistor materials include, but are not limited to, nickel chromium. Discrete resistor materials include, but are not limited to, wire wound, carbon, or glass composition.

By now it can be appreciated that an improved current biasing technique has been provided for minimizing variation in transconductance for an input stage of a CMOS operational amplifier. The transconductance of the input stage of the amplifier is held constant throughout the common mode input range by providing two shunt circuits that vary the current into two differential transistor input pairs, based on common mode input voltage. The differential transistor input pairs are biased such that when the input common mode voltage is halfway between the upper and lower supply voltage, each differential pair is supplied with one-fourth of the maximum current of an input transistor differential pair. When the common mode input voltage changes toward one power supply conductor rail, or a second power supply conductor rail, the current of one of the differential transistor pairs is decreased while the current of the other differential transistor pair is correspondingly increased. Hence, the transconductance of the input stage of the operational amplifier remains constant throughout the common mode operating range of the amplifier.

As an advantage of the present invention, the constant transconductance of the input stage of the amplifier eliminates the need for a higher range of operating current in the output stage of the amplifier used to compensate for varying transconductance in conventional amplifiers. Lower current operation of the amplifier output stage translates to a reduction of the bandwidth requirement for the amplifier and as such, enhances stability for the amplifier. Thus, the current steering technique of the present invention provides a reduced power, highly stable CMOS operational amplifier.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An input stage of an amplifier, comprising:

a first transistor pair differentially coupled for receiving a differential input signal;

a first current source coupled to common sources of said first transistor pair;

a first transistor having a gate, a drain and a source, said source being coupled to said common sources of said first transistor pair, said drain being coupled to a first power supply conductor, said gate being coupled for receiving a first bias potential;

a second transistor pair differentially coupled for receiving said differential input signal;

a second current source coupled to common sources of said second transistor pair;

a second transistor having a gate, a drain and a source, said source being coupled to said common sources of said second transistor pair, said drain being coupled to a second power supply conductor, said gate being coupled for receiving a second bias potential; and a first bias generator for generating said first bias potential, said first bias generator including,
  (a) a third transistor having a gate coupled for receiving a third bias potential,
  (b) a fourth transistor having a gate and a drain coupled together to said gate of said first transistor,
  (c) a fifth transistor having a drain coupled to sources of said third and fourth transistors, a source coupled to said second power supply conductor, and a gate coupled to a control input of said first current source,
  (d) a sixth transistor having a source coupled to said second power supply conductor,
  (e) a first resistor coupled between said gate of said fifth transistor and a gate of said sixth transistor, and
  (f) a current mirror having An input coupled to a drain of said sixth transistor, a first output coupled to a drain of said third transistor, and a second output coupled to said drain and said gate of said fourth transistor.

2. The input stage of an amplifier of claim 1, wherein said first transistor pair are n-channel transistors and said second transistor pair are p-channel transistors.

3. The input stage of the amplifier of claim 1, further including a second bias generator for generating said second bias potential.

4. The input stage of the amplifier of claim 3, wherein said first bias generator includes:

a seventh transistor having a gate coupled to said gate of said fifth transistor, a drain coupled to said gate of said sixth transistor, and a source coupled to said second power supply conductor; and an eighth transistor having a drain coupled to said first power supply conductor, a gate coupled to said drain of said third transistor, and a source coupled to said gate of said fifth transistor.

5. The input stage of the amplifier of claim 4, wherein said current mirror circuit includes:

a ninth transistor having a gate and drain being coupled together to said drain of said sixth transistor, and a source coupled to said first power supply conductor;

a tenth transistor having a source coupled to said first power supply conductor, a gate coupled to said gate of said ninth transistor, and a drain coupled to said drain of said third transistor; and an eleventh transistor having a source coupled to said first power supply conductor, a gate coupled to said gate of said tenth transistor, and a drain coupled to said drain of said fourth transistor.

6. The input stage of the amplifier of claim 5, wherein said second bias generator includes:

a twelfth transistor having a gate coupled for receiving a fourth bias potential, a drain, and a source;

a thirteenth transistor having a gate, a drain coupled to said gate and to said gate of said second transistor, and a source coupled to said source of said twelfth transistor;

a fourteenth transistor having a drain coupled to said source of said thirteenth transistor, a source coupled to said first power supply conductor, and a gate coupled to a control input of said second current source;

a fifteenth transistor having a gate coupled to said gate of said fourteenth transistor, a drain, and a source coupled to said first power supply conductor;

a sixteenth transistor having a drain, a source coupled to said second power supply conductor, and a gate coupled to said drain of said fifteenth transistor and to said gate of said fourteenth transistor;

a second resistor coupled between said gate of said sixteenth transistor and said gate of said fourteenth transistor;

a seventeenth transistor having a gate, a drain, and a source, said gate and drain being coupled together to said drain of said sixteenth transistor, said source coupled to said second power supply conductor;

a eighteenth transistor having a source coupled to said second power supply conductor, a gate coupled to said gate of said seventeenth transistor, and a drain coupled to said drain of said twelfth transistor;

a nineteenth transistor having a source coupled to said second power supply conductor, a gate coupled to said gate of said eighteenth transistor, and a drain coupled to said drain of said thirteenth transistor; and a twentieth transistor having a source coupled to said second power supply conductor, a gate coupled to said drain of said twelfth transistor, and a drain coupled to said gate of said fourteenth transistor.

7. The input stage of the amplifier of claim 6, wherein said twelfth, thirteenth, fourteenth, fifteenth, sixteenth, and twentieth transistors are p-channel transistors and said seventeenth, eighteenth, and nineteenth transistors are N-channel transistors.

8. An input stage of an amplifier, comprising:

a first differential transistor pair coupled for receiving a differential input signal having a common mode voltage;

first circuit means coupled to common sources of said first differential transistor pair for varying current flow through said first differential transistor pair in response to said common mode voltage of said differential input signal;

a second differential transistor pair coupled for receiving said differential input signal; and second circuit means coupled to common sources of said second differential transistor pair for varying current flow through said second differential transistor pair in response to said common mode voltage of said differential input signal, said second circuit means varying current flow through said second differential transistor pair independent of said first circuit means varying current flow through said first differential transistor pair to maintain a constant transconductance for the amplifier.

9. The input stage of the amplifier of claim 8, wherein said first and second circuit means includes:

a first current source coupled to common sources of said first differential transistor pair;

a first transistor having a gate, a drain and a source, said source being coupled to said common sources of said first differential transistor pair, said drain being coupled to a first power supply conductor, said gate being coupled for receiving a first bias potential;

a second current source coupled to common sources of said second differential transistor pair; and a second transistor having a gate, a drain and a source, said source being coupled to said common sources of said second differential transistor pair, said drain being coupled to a second power supply conductor, said gate being coupled for receiving a second bias potential.

10. A circuit, comprising:

a first transistor pair differentially coupled for receiving a differential input signal;

first circuit means coupled to common sources of said first transistor pair for varying current flow through said first transistor pair to establish a first transconductance in response to a first control signal that is dependent on temperature and process variation;

a second transistor pair differentially coupled for receiving said differential input signal; and second circuit means coupled to common sources of said second transistor pair for varying current flow through said second transistor pair to establish a second transconductance in response to a second control signal that is dependent on temperature and process variation where said second transconductance is matched to said first transconductance so that varying current flow through the second differential transistor pair is independent of the first circuit means varying current flow through the first transistor pair.

11. The circuit of claim 10, wherein said first circuit means includes:

a first current source coupled to common sources of said first transistor pair; and a first transistor having a gate, a drain and a source, said source being coupled to said common sources of said first transistor pair, said drain being coupled to a first power supply conductor, said gate being coupled for receiving a first bias potential.

12. The circuit of claim 11, wherein said second circuit means includes:

a second current source coupled to common sources of said second transistor pair; and a second transistor having a gate, a drain and a source, said source being coupled to said common sources of said second transistor pair, said drain being coupled to a second power supply conductor, said gate being coupled for receiving a second bias potential.

13. The circuit of claim 12, further including:

a first bias generator for generating said first bias potential; and a second bias generator for generating said second bias potential.

14. The circuit of claim 13, wherein said first bias generator includes:

a third transistor having a gate coupled for receiving a third bias potential, a drain, and a source;

a fourth transistor having a gate, a drain coupled to said gate and to said gate of said first transistor, and a source coupled to said source of said third transistor;

a fifth transistor having a drain coupled to said source of said fourth transistor, a source coupled to said second power supply conductor, and a gate coupled to a control input of said first current source;

a sixth transistor having a gate coupled to said gate of said fifth transistor, a drain, and a source coupled to said second power supply conductor;

a seventh transistor having a drain, a source coupled to said second power supply conductor, and a gate coupled to said drain of said sixth transistor and to said gate of said fifth transistor;

a first resistor coupled between said gate of said seventh transistor and said gate of said fifth transistor;

an eighth transistor having a gate, a drain, and a source, said gate and drain being coupled together to said drain of said seventh transistor, said source coupled to said first power supply conductor;

a ninth transistor having a source coupled to said first power supply conductor, a gate coupled to said gate of said eighth transistor, and a drain coupled to said drain of said third transistor;

a tenth transistor having a source coupled to said first power supply conductor, a gate coupled to said gate of said ninth transistor, and a drain coupled to said drain of said fourth transistor; and an eleventh transistor having a source coupled to said first power supply conductor, a gate coupled to said drain of said third transistor, and a drain coupled to said gate of said fifth transistor.

15. The circuit of claim 14, wherein said second bias generator includes:

a twelfth transistor having a gate coupled for receiving a fourth bias potential, a drain, and a source;

a thirteenth transistor having a gate, a drain coupled to said gate and to said gate of said second transistor, and a source coupled to said source of said twelfth transistor;

a fourteenth transistor having a drain coupled to said source of said thirteenth transistor, a source coupled to said first power supply conductor, and a gate coupled to a control input of said second current source;

a fifteenth transistor having a gate coupled to said gate of said fourteenth transistor, a drain, and a source coupled to said first power supply conductor;

a sixteenth transistor having a drain, a source coupled to said first power supply conductor, and a gate coupled to said drain of said fifteenth transistor and to said gate of said fourteenth transistor;

a second resistor coupled between said gate of said sixteenth transistor and said gate of said fourteenth transistor;

a seventeenth transistor having a gate, a drain, and a source, said gate and drain being coupled together to said drain of said sixteenth transistor, said source coupled to said second power supply conductor;

a eighteenth transistor having a source coupled to said second power supply conductor, a gate coupled to said gate of said seventeenth transistor, and a drain coupled to said drain of said twelfth transistor;

a nineteenth transistor having a source coupled to said second power supply conductor, a gate coupled to said gate of said eighteenth transistor, and a drain coupled to said drain of said thirteenth transistor; and a twentieth transistor having a source coupled to said second power supply conductor, a gate coupled to said drain of said twelfth transistor, and a drain coupled to said gate of said fourteenth transistor.

16. The circuit of claim 15, wherein said first and second resistors are temperature and process dependent.

17. A method of establishing matched transconductances for differentially coupled transistor pairs, comprising the steps of:

providing a first transistor pair differentially coupled for receiving a differential input signal having a common mode voltage;

varying current flow through said first transistor pair to establish a first transconductance in response to a first control signal that is dependent on temperature and process variation;

providing a second transistor pair differentially coupled for receiving said differential input signal having a common mode voltage; and varying current flow through said second transistor pair to establish a second transconductance in response to a second control signal that is dependent on temperature and process variation where said second transconductance is matched to said first transconductance, where varying current flow through the second transistor pair is independent of varying current flow through the first transistor pair.

18. The method of claim 17, for varying current flow through said first transistor pair, further comprising the steps of:

providing a first current source coupled to sources of said first transistor pair for sinking a first current;

providing a first shunt transistor coupled to said sources of said first transistor pair;

providing a first bias potential to said first shunt transistor to establish a first shunt current; and selecting the size of said first shunt transistor to provide said first shunt current that is three-fourths of said first current of said first current source when said common mode voltage equals said first bias potential.

19. The method of claim 18, for varying current flow through said second transistor pair, further comprising the steps of:

providing a second current source coupled to sources of said second transistor pair for sinking a second current;

providing a second shunt transistor coupled to sources of said second transistor pair;

providing a second bias potential to said second shunt transistor to establish a second shunt current; and selecting the size of said second shunt transistor to provide said second shunt current that is three-fourths of said second current of said second current source when said common mode voltage equals said second bias potential.

* * * * *